(12) United States Patent
Kreutz et al.

(10) Patent No.: US 11,974,496 B2
(45) Date of Patent: Apr. 30, 2024

(54) ORGANOMETALLIC COMPLEXES AND RELATED COMPOSITIONS AND METHODS

(71) Applicant: Fernando Thome Kreutz, Porto Alegre (BR)

(72) Inventors: Fernando Thome Kreutz, Porto Alegre (BR); Cameron Capeletti Da Silva, Goiania (BR); Felipe Terra Martins, Goiania (BR); Lauro June Queiroz Maia, Goiania (BR); Jose Antonio Do Nascimento Neto, Goiania (BR)

( * ) Notice: Subject to any disclaimer, the term of this patent is extended or adjusted under 35 U.S.C. 154(b) by 995 days.

(21) Appl. No.: 16/609,143

(22) PCT Filed: Apr. 28, 2018

(86) PCT No.: PCT/IB2018/052957
§ 371 (c)(1),
(2) Date: Aug. 3, 2020

(87) PCT Pub. No.: WO2018/198096
PCT Pub. Date: Nov. 1, 2018

(65) Prior Publication Data
US 2021/0135132 A1 May 6, 2021

Related U.S. Application Data

(60) Provisional application No. 62/491,754, filed on Apr. 28, 2017.

(51) Int. Cl.
| | | |
|---|---|---|
| *H10K 85/30* | (2023.01) | |
| *C07F 3/00* | (2006.01) | |
| *C09K 11/06* | (2006.01) | |
| *H10K 50/11* | (2023.01) | |
| *H10K 101/10* | (2023.01) | |

(52) U.S. Cl.
CPC ........... *H10K 85/381* (2023.02); *C07F 3/003* (2013.01); *C09K 11/06* (2013.01); *C09K 2211/1044* (2013.01); *C09K 2211/188* (2013.01); *H10K 50/11* (2023.02); *H10K 2101/10* (2023.02)

(58) Field of Classification Search
CPC .. H10K 85/381; H10K 50/11; H10K 2101/10; H10K 85/761; H10K 50/00; C07F 3/003; C07F 3/08; C07F 3/00; C09K 11/06; C09K 2211/1044; C09K 2211/188
See application file for complete search history.

(56) References Cited

FOREIGN PATENT DOCUMENTS

CN 106432294 A 2/2017

OTHER PUBLICATIONS

J. Am. Chem. Soc. 2019, 141, 8, 3400-3403. (Year: 2019).*
Machine Translation of CN 106432294 A (publication date Feb. 2017). (Year: 2019).*
Speakman, S. A. (2011). Basics of X-ray powder diffraction. Massachusetts-USA, 2011a. Disponível em :< http://prism.mit.edu/xray/Basics%20of%20X-Ray%20Powder%20Diffraction.pdf. (Year: 2011).*
Office Action dated Apr. 2, 2022, in corresponding Japanese Patent Application No. JP2019-558783, 3 pages.
Jia, et al., (Jun. 10, 2011), "Two Cd(II) complexes with xanthene-9-carboxylate ligand: syntheses, crystal structures, and emission properties", Journal of Coordination Chemistry, vol. 64, No. 11, pp. 1849-1858.
Celik, et al (2014) "catena-Poly[[aquabis(4-formylbenzoato-k2O1O1)cadmium]-µ-pyrazine-k2N:N']", Acta Cryst., Issue 70, pp. m37-m38.
Registry Copyright 2022 ACS on STN, RN 2087890-63-7 Registry, Entered STN: Mar. 21, 2017, Index Name not yet assigned, MF C20 H27 Cd N3 09, CI CCS, COM, SR CA.
Jia, Li-Ran et al., Two Cd(II) complexes with xanthene-9-carboxylate ligand: syntheses, crystal structures, and emission properties, Journal of Coordination Chemistry, 64:11, Jun. 2011, 1849-1858.
Celik, Fatih et al., catena-Poly[[aquabis(4-formylbenzoato-k2O1, O1)cadmium]-u-pyrazine-k2N:N1], Acta Cryst., Section E (2014).

* cited by examiner

*Primary Examiner* — Dawn L Garrett
(74) *Attorney, Agent, or Firm* — Denise L. Mayfield; DYKEMA GOSSETT PLLC

(57) ABSTRACT

Provided herein is a coordination complex of Formula (1):

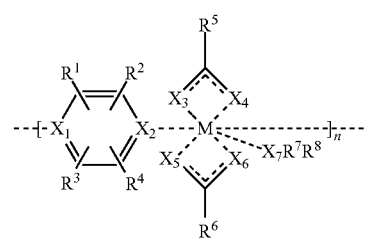

Formula (I)

wherein ----- is a coordinate bond;
where M is a metal;
$X_1$, $X_2$, $X_3$, $X_4$, $X_5$, $X_6$, and $X_7$ are each independently selected from a heteroatom;
$R^1$, $R^2$, $R^3$, $R^4$, $R^7$, and $R^8$ are each independently selected from H and a saturated or unsaturated, substituted or unsubstituted, cyclic or linear hydrocarbon comprising from 1 to 8 carbon atoms;
$R^5$ and $R^6$ are each independently selected from H and a saturated or unsaturated, substituted or unsubstituted, cyclic or linear hydrocarbon comprising from 1 to 8 carbon atoms; and
n is an integer.

19 Claims, 9 Drawing Sheets

A

B

A

B

A

B

ORGANOMETALLIC COMPLEXES AND RELATED COMPOSITIONS AND METHODS

FIELD

The present invention relates to coordination complexes. More specifically, the present invention is, in aspects, concerned with blue light-emitting coordination complexes, related polymers and compositions, and methods of making and using same.

BACKGROUND

Organic light emitting devices (OLEDs) as solid state lighting sources have meant the enterprise of display technologies[1-3]. In this context, the search for new light-emitting materials in the solid state with maximum external quantum efficiency (EQE) in the visible spectral range is desired to improve the performance of electronic devices and has attracted interest of many chemists of materials and electronics companies[4-9]. The higher the external efficiency of a light-emitter, the higher will be its applicability into OLEDs of practical uses. In this context, photoluminescence assessment is the first step in the screening of such new promising candidates[7,8,10-17]. Recently, heavy-metal complexes have been extensively explored in order to obtain high internal quantum efficiency (IQE) in the solid state, approaching 100%[7,8,14-16,18-22], even though EQE does not reach ca. 50%.

There is a need for alternative compositions to overcome or mitigate at least some of the deficiencies of the prior art, or to provide a useful alternative.

SUMMARY

In accordance with an aspect, there is provided a coordination complex of Formula (I):

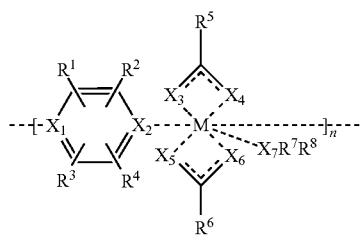

Formula (I)

wherein -------- is a coordinate bond;
where M is a metal;
$X_1$, $X_2$, $X_3$, $X_4$, $X_5$, $X_6$, and $X_7$ are each independently selected from a heteroatom;
$R^1$, $R^2$, $R^3$, $R^4$, $R^7$, and $R^8$ are each independently selected from H and a saturated or unsaturated, substituted or unsubstituted, cyclic or linear hydrocarbon comprising from 1 to 8 carbon atoms;
$R^5$ and $R^6$ are each independently selected from H and a saturated or unsaturated, substituted or unsubstituted, cyclic or linear hydrocarbon comprising from 1 to 8 carbon atoms; and
n is an integer.

In an aspect, M is a metal selected from the group consisting of Zn, Cd, Hg, and a transition metal with 2 valence electrons.

In an aspect, M is Cd.

In an aspect, at least one of $X_1$ and $X_2$ is N.
In an aspect, $X_1$ and $X_2$ are both N.
In an aspect, $X_3$, $X_4$, $X_5$, $X_6$, and $X_7$ are each independently selected from the group consisting of O, S, and Se.
In an aspect, at least one of $X_3$, $X_4$, $X_5$, $X_6$, and $X_7$ is O.
In an aspect, $X_3$, $X_4$, $X_5$, $X_6$, and $X_7$, are the same.
In an aspect, each of $X_3$, $X_4$, $X_5$, $X_6$, and $X_7$ is O.
In an aspect, at least one of $R^1$, $R^2$, $R^3$, $R^4$ is $NH_2$.
In an aspect, one of $R^1$, $R^2$, $R^3$, $R^4$ is $NH_2$ and three of $R^1$, $R^2$, $R^3$, $R^4$ are H.
In an aspect, the $NH_2$ is disordered over two occupancy sites.
In an aspect, the $NH_2$ is disordered over the two occupancy sites with an occupancy factor of about 50%.
In an aspect, at least one of $R^5$ and $R^6$ is $CH_3$.
In an aspect, $R^5$ and Rare both $CH_3$.
In an aspect, at least one of $R^7$ and $R^8$ is H.
In an aspect, $R^7$ and $R^8$ are both H.
In an aspect, n is 1.
In an aspect, n is from about 1 to about 100, such as from about 1 to about 75, such as from about 1 to about 50, such as from about 1 to about 25, such as from about 1 to about 20, such as from about 1, 2, 3, 4, 5, 6, 7, 8, 9, 10, 11, 12, 13, 14, 15, 16, 17, 18, or 19 to about 2, 3, 4, 5, 6, 7, 8, 9, 10, 11, 12, 13, 14, 15, 16, 17, 18, 19 or 20.

In an aspect, the coordination complex is of Formula (II):

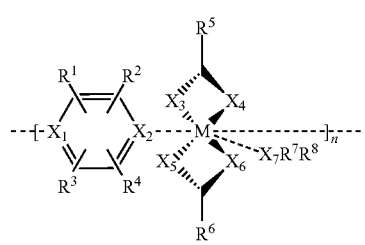

Formula (II)

In an aspect, the coordination complex is of Formula (III):

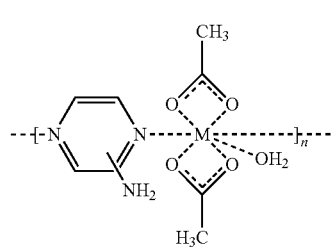

Formula (III)

In accordance with an aspect, there is provided a coordination complex comprising the formula $[Cd(C_4H_5N_3)(C_2H_3O_2)_2(H^2O)]_n$, wherein n is an integer.

In an aspect, n is 1.
In an aspect, n is from about 1 to about 100, such as from about 1 to about 75, such as from about 1 to about 50, such as from about 1 to about 25, such as from about 1 to about 20, such as from about 1, 2, 3, 4, 5, 6, 7, 8, 9, 10, 11, 12, 13, 14, 15, 16, 17, 18, or 19 to about 2, 3, 4, 5, 6, 7, 8, 9, 10, 11, 12, 13, 14, 15, 16, 17, 18, 19, or 20.

In an aspect, the coordination complex comprises the formula $[Cd(aminopyrazine)(acetate)_2(H_2O)]_n$.

In an aspect, the coordination complex comprises a functionalized moiety.

In an aspect, the functionalized moiety is bifunctional.

In accordance with an aspect, there is provided a coordination complex comprising a central metal atom coordinated by a nitrogen atom of aminopyrazine, two bidentate ligands, and an oxygen atom of water.

In an aspect, the bidentate ligands are selected from formate and acetate, optionally wherein at least one O is substituted with S or Se.

In accordance with an aspect, there is provided a coordination polymer comprising the coordination complex described herein.

In an aspect, the polymer forms a one-dimensional polymer chain.

In accordance with an aspect, there is provided a solution comprising the coordination complex or the polymer described herein.

In an aspect, the coordination complex is monomeric.

In accordance with an aspect, there is provided a crystalline compound of the structure as seen in FIG. 1(C).

In accordance with an aspect, there is provided a blue emitting crystal form based on a cadmium coordination polymer comprising an external quantum efficiency of greater than 70%.

In accordance with an aspect, there is provided a crystalline compound comprising the powder X-ray diffraction pattern as seen in FIG. 9.

In accordance with an aspect, there is provided a crystalline compound comprising x-ray diffraction peaks at the following 2θ positions, within a ±0.200° range: (peaks with normalized intensities equal or higher than 10% are listed):

| | | | | |
|---|---|---|---|---|
| 8.105; | 14.327; | 20.127; | 26.546; | 36.233; |
| 12.474; | 15.347; | 23.857; | 34.253; | 36.868; |
| 13.184; | 16.251; | 24.068; | 35.462; | 37.148; |
| 13.797; | 16.979; | 24.327; | 36.063; | 39.641. |

In accordance with an aspect, there is provided a monomer of the crystalline compound described herein.

In an aspect, the monomer is in solution.

In accordance with an aspect, there is provided an OLED comprising an anode, a cathode, and there between a light-emitting layer comprising the coordination complex, the coordination polymer, or the crystalline compound described herein.

In accordance with an aspect, there is provided a novelty item comprising the coordination complex, the coordination polymer, the solution, the crystalline compound, or the monomer described herein.

In accordance with an aspect, there is provided a peptide comprising the coordination complex, the coordination polymer, the crystalline compound, or the monomer described herein.

In an aspect, the peptide is an antibody or antigen.

In accordance with an aspect, there is provided a light emitting device comprising the coordination complex, the coordination polymer, or the crystalline compound described herein.

In an aspect, the light emitting device is a lamp.

In accordance with an aspect, there is provided a nanoparticle comprising the coordination complex, the coordination polymer, the crystalline compound, or the monomer described herein.

In an aspect, the nanoparticle comprises a coating.

Other features and advantages of the present invention will become apparent from the following detailed description. It should be understood, however, that the detailed description and the specific examples while indicating embodiments of the invention are given by way of illustration only, since various changes and modifications within the spirit and scope of the invention will become apparent to those skilled in the art from said detailed description.

DESCRIPTION OF THE FIGURES

The present invention will be further understood from the following description with reference to the Figures, in which:

FIG. 1 (B) shows an expanded one-dimensional polymer chain along the Cd—N1 bond. The hydrogen atoms were hidden for clarity. FIG. 1 (C) shows the crystal structure drawing of $[Cd(C_4H_4N_3)(C_2H_3O_2)]_2(H_2O)_n$. Dashed lines outline hydrogen bonds. CH hydrogens and NH2 group fraction with 48.0(2)% occupancy, which is bonded to carbon vicinal to that holding the shown 52.0(2)% NH2 sites, were omitted for clarity.

FIG. 6 (A) shows a photograph of a flask containing the cadmium (II)-based complex, aminopyrazine and acetate taken under normal light. FIG. 6 (B) shows a photograph of the flask in a darkroom under UVA light, but with the lid of the instrument blocking the UVA light. FIG. 6 (C) shows a photograph of the flask in a darkroom under UVA light at 366 nm.

FIG. 7 (B) shows a photograph of 5 mg of the cadmium (11)-based complex diluted in 1 mL of 96% ethanol (right). The left microtube was used as a control and contained only 96% ethanol.

DETAILED DESCRIPTION

Figure 1:
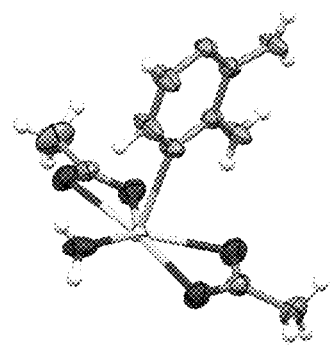
FIG. 1 (A) shows the asymmetric unit of the organometallic complex based on cadmium (II), aminopyrazine and acetate. Thermal ellipsoids at a 50% probability represent atoms, except for hydrogen atoms (represented as spheres of arbitrary radius). In addition, two disordered sites were found for the nitrogen atom of the amino group, which were freely refined with an occupancy factor rate of about 50% each.
Figure 1:
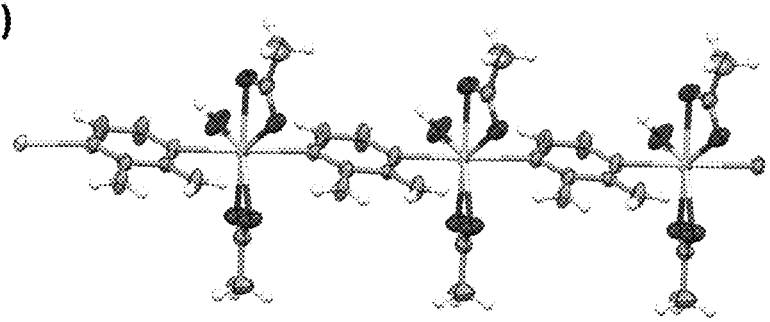
Figure 1:
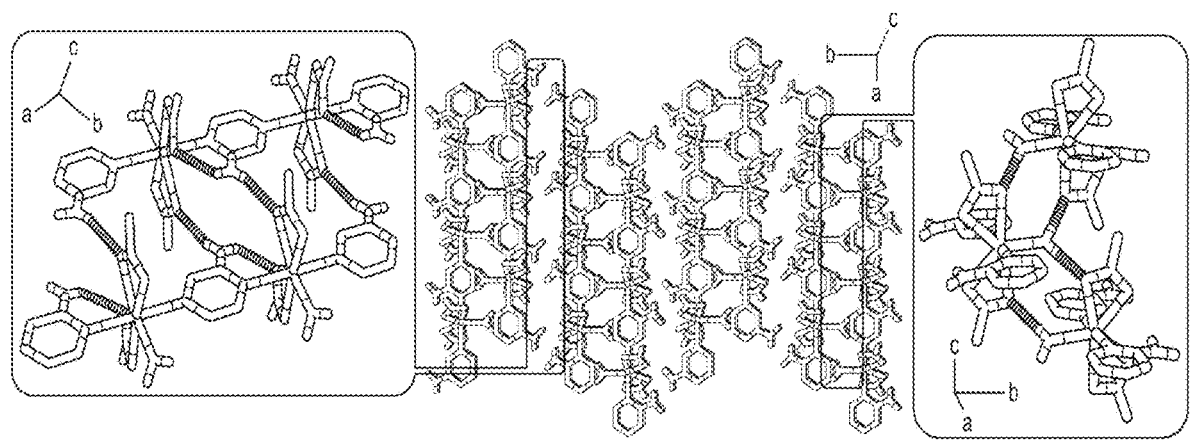
Figure 2:
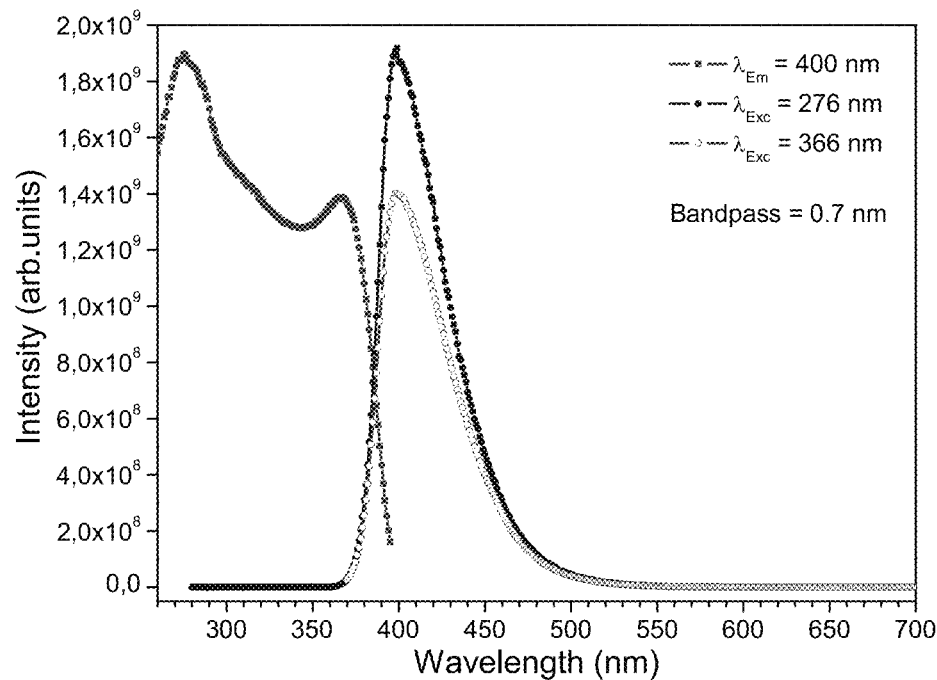
FIGS. 2 (A) and 2 (B) show the photoluminescent spectra of the organometallic complex of the present invention with observed and normalized intensities, respectively. The internal and external quantum yields were calculated and measured 74.64±0.02% and 55.0±0.1%, respectively.
Figure 2:
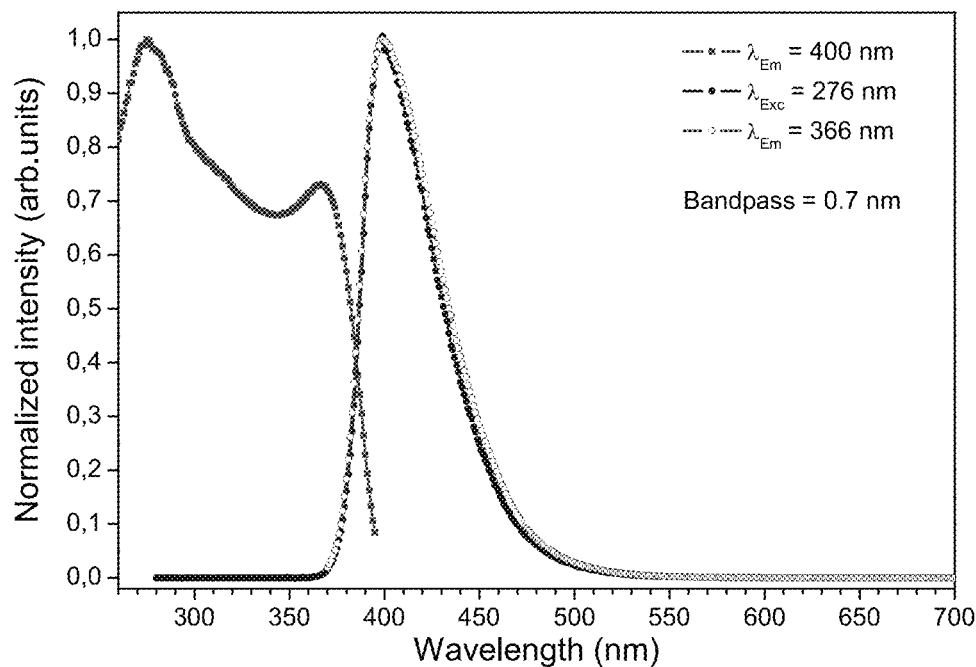
Figure 3:
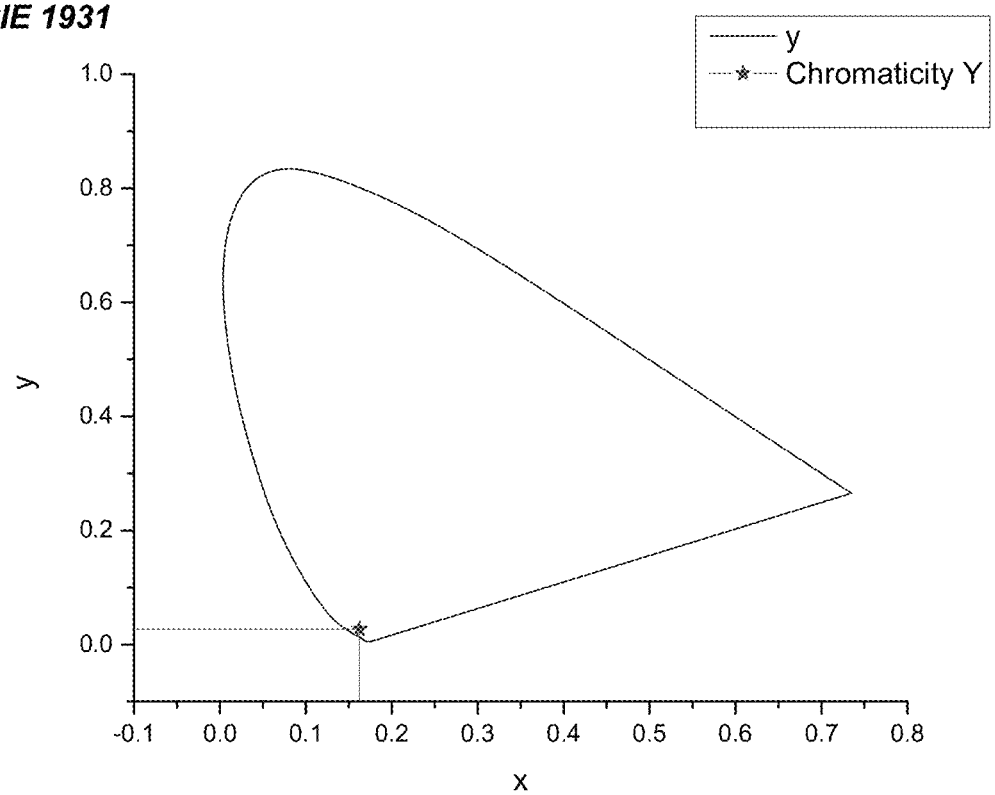
FIG. 3 shows a chromaticity diagram. It is noted that the organometallic complex based on cadmium (II), aminopyrazine and acetate exhibits a very saturated and pure blue color.
Figure 4:
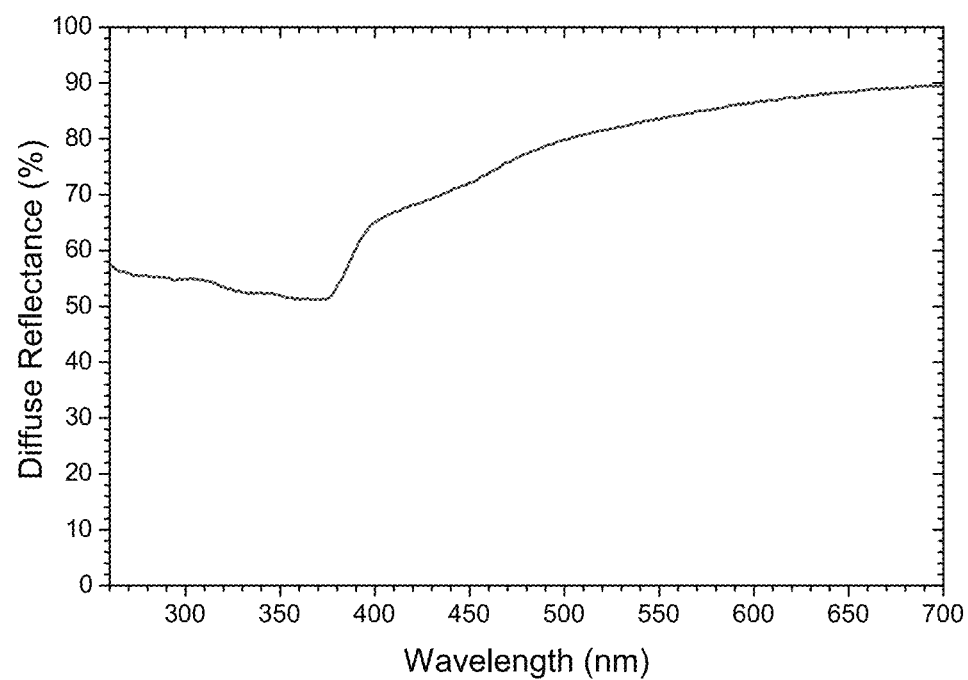
FIG. 4 shows the diffuse reflectance spectrum of the organometallic complex based on cadmium (II), aminopyrazine and acetate.

Described herein, in aspects, are novel bright deep-blue emitting crystal forms based on a simple cadmium coordination polymer with an impressive EQE of 75.4%, which means, at least up to now, the most efficient photoluminescent material in the solid state for the fabrication of blue OLED devices. Furthermore, its synthesis is achieved at room temperature in one solution preparation step needing only low cost reagents (cadmium acetate dihydrate and aminopyrazine in equimolar ratio) and vehicle (ethyl alcohol), followed by slow vehicle evaporation and isolation of the monophasic product crystalline material, adding still more attractive advantages to this material.

Definitions

For purposes herein, the chemical elements are identified in accordance with the Periodic Table of the Elements, CAS version, *Handbook of Chemistry and Physics*, 75$^{th}$Ed., inside cover, and specific functional groups are generally defined as described therein. Additionally, general principles of organic chemistry, as well as specific functional moieties and reactivity, are described in Organic Chemistry, Thomas Sorrell, University Science Books, Sausalito, 1999; Smith and March *March's Advanced Organic Chemistry*, 5$^{th}$ Edition, John Wiley & Sons, Inc., New York, 2001; Larock, *Comprehensive Organic Transformations*, VCH Publishers, Inc., New York, 1989; Carruthers, *Some Modern Methods of Organic Synthesis*, 3$^{rd}$ Edition, Cambridge University Press, Cambridge, 1987.

The term "pharmaceutically acceptable" means that the compound or combination of compounds is compatible with the remaining ingredients of a formulation for pharmaceutical use, and that it is generally safe for administering to humans according to established governmental standards, including those promulgated by the United States Food and Drug Administration.

The term "pharmaceutically acceptable carrier" includes, but is not limited to solvents, dispersion media, coatings, antibacterial agents, antifungal agents, isotonic and/or absorption delaying agents and the like. The use of pharmaceutically acceptable carriers is well known.

The compounds described herein may have asymmetric centers, chiral axes, and chiral planes (as described, for example, in: E. L. Eliel and S. H. Wilen, Stereo-chemistry of Carbon Compounds, John Wiley & Sons, New York, 1994, pages 1119-1190), and occur as racemates, racemic mixtures, and as individual diastereomers, with all possible isomers and mixtures thereof, including optical isomers, E isomers, and Z isomers, being included herein. In addition, the compounds disclosed herein may exist as tautomers and both tautomeric forms are intended to be encompassed, even though only one tautomeric structure may be depicted.

Generally, reference to a certain element such as hydrogen or H is meant to, if appropriate, include all isotopes of that element.

Where the term "alkyl group" is used, either alone or within other terms such as "haloalkyl group" and "alkylamino group", it encompasses linear or branched carbon radicals having, for example, one to about twenty carbon atoms or, in specific embodiments, one to about twelve carbon atoms. In other embodiments, alkyl groups are "lower alkyl" groups having one to about six carbon atoms. Examples of such groups include, but are not limited thereto, methyl, ethyl, n-propyl, isopropyl, n-butyl, isobutyl, sec-butyl, tert-butyl, pentyl, iso-amyl, hexyl and the like. In more specific embodiments, lower alkyl groups have one to four carbon atoms.

The term "alkenyl group" encompasses linear or branched carbon radicals having at least one carbon-carbon double bond. The term "alkenyl group" can encompass conjugated and non-conjugated carbon-carbon double bonds or combinations thereof. An alkenyl group, for example and without being limited thereto, can encompass two to about twenty carbon atoms or, in a particular embodiment, two to about twelve carbon atoms. In embodiments, alkenyl groups are "lower alkenyl" groups having two to about four carbon atoms. Examples of alkenyl groups include, but are not limited thereto, ethenyl, propenyl, allyl, propenyl, butenyl and 4-methylbutenyl. The terms "alkenyl group" and "lower alkenyl group", encompass groups having "cis" and "trans" orientations, or alternatively "E" and "Z" orientations.

The term "alkynyl group" denotes linear or branched carbon radicals having at least one carbon-carbon triple bond. The term "alkynyl group" can encompass conjugated and non-conjugated carbon-carbon triple bonds or combinations thereof. Alkynyl group, for example and without being limited thereto, can encompass two to about twenty carbon atoms or, in a particular embodiment, two to about twelve carbon atoms. In embodiments, alkynyl groups are "lower alkynyl" groups having two to about ten carbon atoms. Some examples are lower alkynyl groups having two to about four carbon atoms. Examples of such groups include propargyl, butynyl, and the like.

The term "halo" means halogens such as fluorine, chlorine, bromine or iodine atoms.

The term "haloalkyl group" encompasses groups wherein any one or more of the alkyl carbon atoms is substituted with halo as defined above. Specifically encompassed are mono-haloalkyl, dihaloalkyl and polyhaloalkyl groups including perhaloalkyl. A monohaloalkyl group, for one example, may have either an iodo, bromo, chloro or fluoro atom within the group. Dihalo and polyhaloalkyl groups may have two or more of the same halo atoms or a combination of different halo groups. "Lower haloalkyl group" encompasses groups having 1-6 carbon atoms. In some embodiments, lower haloalkyl groups have one to three carbon atoms. Examples of haloalkyl groups include fluoromethyl, difluoromethyl, trifluoromethyl, chloromethyl, dichloromethyl, trichloromethyl, pentafluoroethyl, heptafluoropropyl, difluorochioromethyl, dichlorofluoromethyl, difluoroethyl, difluoropropyl, dichloroethyl and dichioropropyl.

The term "hydroxyalkyl group" encompasses linear or branched alkyl groups having, for example and without being limited thereto, one to about ten carbon atoms, any one of which may be substituted with one or more hydroxyl groups. In embodiments, hydroxyalkyl groups are "lower hydroxyalkyl" groups having one to six carbon atoms and one or more hydroxyl groups. Examples of such groups include hydroxymethyl, hydroxyethyl, hydroxypropyl, hydroxybutyl and hydroxyhexyl.

The term "alkoxy group" encompasses linear or branched oxy-containing groups each having alkyl portions of, for example and without being limited thereto, one to about ten carbon atoms. In embodiments, alkoxy groups are "lower alkoxy" groups having one to six carbon atoms. Examples of such groups include methoxy, ethoxy, propoxy, butoxy and tert-butoxy. In certain embodiments, lower alkoxy groups have one to three carbon atoms. The "alkoxy" groups may be further substituted with one or more halo atoms, such as fluoro, chloro or bromo, to provide "haloalkoxy" groups. In other embodiments, lower haloalkoxy groups have one to three carbon atoms. Examples of such groups include fluoromethoxy, chloromethoxy, trifluoromethoxy, trifluoroethoxy, fluoroethoxy, and fluoropropoxy.

The term "aromatic group" or "aryl group" means an aromatic group having one or more rings wherein such rings may be attached together in a pendent manner or may be fused. In particular embodiments, an aromatic group is one, two or three rings. Monocyclic aromatic groups may contain 4 to 10 carbon atoms, typically 4 to 7 carbon atoms, and more typically 4 to 6 carbon atoms in the ring. Typical polycyclic aromatic groups have two or three rings. Polycyclic aromatic groups having two rings typically have 8 to 12 carbon atoms, preferably 8 to 10 carbon atoms in the rings. Examples of aromatic groups include, but are not limited to, phenyl, naphthyl, tetrahydronaphthyl, indanyl, biphenyl, phenanthryl, anthryl or acenaphthyl.

The term "heteroatom" means an atom other than carbon. Typically, heteroatoms are selected from the group consisting of sulfur, phosphorous, nitrogen and oxygen atoms. Groups containing more than one heteroatom may contain different heteroatoms.

The term "heteroaromatic group" or "heteroaryl group" means an aromatic group having one or more rings wherein such rings may be attached together in a pendent manner or may be fused, wherein the aromatic group has at least one heteroatom. Monocyclic heteroaromatic groups may contain 4 to 10 member atoms, typically 4 to 7 member atoms, and more typically 4 to 6 member atoms in the ring. Typical polycyclic heteroaromatic groups have two or three rings. Polycyclic aromatic groups having two rings typically have 8 to 12 member atoms, more typically 8 to 10 member atoms in the rings. Examples of heteroaromatic groups include, but are not limited thereto, pyrrole, imidazole, thiazole, oxazole, furan, thiophene, triazole, pyrazole, isoxazole, isothiazole, pyridine, pyrazine, pyridazine, pyrimidine, triazine, indole, benzofuran, benzothiophene, benzimidazole, benzthiazole, quinoline, isoquinoline, quinazoline, quinoxaline and the like.

The term "carbocyclic group" means a saturated or unsaturated carbocyclic hydrocarbon ring. Carbocyclic groups are not aromatic. Carbocyclic groups are monocyclic or polycyclic. Polycyclic carbocyclic groups can be fused, spiro, or bridged ring systems. Monocyclic carbocyclic groups may contain 4 to 10 carbon atoms, typically 4 to 7 carbon atoms, and more typically 5 to 6 carbon atoms in the ring. Bicyclic carbocyclic groups may contain 8 to 12 carbon atoms, typically 9 to 10 carbon atoms in the rings.

The term "heterocyclic group" means a saturated or unsaturated ring structure containing carbon atoms and 1 or more heteroatoms in the ring. Heterocyclic groups are not aromatic. Heterocyclic groups are monocyclic or polycyclic. Polycyclic heterocyclic groups can be fused, spiro, or bridged ring systems. Monocyclic heterocyclic groups may contain 4 to 10 member atoms (i.e., including both carbon atoms and at least 1 heteroatom), typically 4 to 7, and more typically 5 to 6 in the ring. Bicyclic heterocyclic groups may contain 8 to 18 member atoms, typically 9 or 10 member atoms in the rings. Representative heterocyclic groups include, by way of example, pyrrolidine, imidazolidine, pyrazolidine, piperidine, 1,4-dioxane, morpholine, thiomorpholine, piperazine, 3-pyrroline and the like.

The term "heterogeneous group" means a saturated or unsaturated chain of non-hydrogen member atoms comprising carbon atoms and at least one heteroatom. Heterogeneous groups typically have 1 to 25 member atoms. More typically, the chain contains 1 to 12 member atoms, 1 to 10, and most typically 1 to 6. The chain may be linear or branched. Typical branched heterogeneous groups have one or two branches, more typically one branch. Typically, heterogeneous groups are saturated. Unsaturated heterogeneous groups may have one or more double bonds, one or more triple bonds, or both. Typical unsaturated heterogeneous groups have one or two double bonds or one triple bond. More typically, the unsaturated heterogeneous group has one double bond.

The term "hydrocarbon group" or "hydrocarbyl group" means a chain of 1 to 25 carbon atoms, typically 1 to 12 carbon atoms, more typically 1 to 10 carbon atoms, and most typically 1 to 8 carbon atoms. Hydrocarbon groups may have a linear or branched chain structure. Typical hydrocarbon groups have one or two branches, typically one branch. Typically, hydrocarbon groups are saturated. Unsaturated hydrocarbon groups may have one or more double bonds, one or more triple bonds, or combinations thereof. Typical unsaturated hydrocarbon groups have one or two double bonds or one triple bond; more typically unsaturated hydrocarbon groups have one double bond.

When the term "unsaturated" is used in conjunction with any group, the group may be fully unsaturated or partially unsaturated. However, when the term "unsaturated" is used in conjunction with a specific group defined herein, the term maintains the limitations of that specific group. For example, an unsaturated "carbocyclic group", based on the limitations of the "carbocyclic group" as defined herein, does not encompass an aromatic group.

The terms "carboxy group" or "carboxyl group", whether used alone or with other terms, such as "carboxyalkyl group", denotes —(C=O)—O—.

The term "carbonyl group", whether used alone or with other terms, such as "aminocarbonyl group", denotes —(C=O)—.

The terms "alkylcarbonyl group" denotes carbonyl groups which have been substituted with an alkyl group. In certain embodiments, "lower alkylcarbonyl group" has lower alkyl group as described above attached to a carbonyl group.

The term "aminoalkyl group" encompasses linear or branched alkyl groups having one to about ten carbon atoms any one of which may be substituted with one or more amino groups. In some embodiments, the aminoalkyl groups are "lower aminoalkyl" groups having one to six carbon atoms and one or more amino groups. Examples of such groups include aminomethyl, aminoethyl, aminopropyl, aminobutyl and aminohexyl.

The term "alkylaminoalkyl group" encompasses aminoalkyl groups having the nitrogen atom independently substituted with an alkyl group. In certain embodiments, the alkylaminoalkyl groups are "loweralkylaminoalkyl" groups having alkyl groups of one to six carbon atoms. In other embodiments, the lower alkylaminoalkyl groups have alkyl groups of one to three carbon atoms. Suitable alkylaminoalkyl groups may be mono or dialkyl substituted, such as N-methylaminomethyl, N,N-dimethyl-aminoethyl, N,N-diethylaminomethyl and the like.

The term "aralkyl group" encompasses aryl-substituted alkyl groups. In embodiments, the aralkyl groups are "lower aralkyl" groups having aryl groups attached to alkyl groups having one to six carbon atoms. In other embodiments, the lower aralkyl groups phenyl is attached to alkyl portions having one to three carbon atoms. Examples of such groups include benzyl, diphenylmethyl and phenylethyl. The aryl in said aralkyl may be additionally substituted with halo, alkyl, alkoxy, haloalkyl and haloalkoxy.

The term "arylalkenyl group" encompasses aryl-substituted alkenyl groups. In embodiments, the arylalkenyl groups are "lower arylalkenyl" groups having aryl groups attached to alkenyl groups having two to six carbon atoms. Examples of such groups include phenylethenyl. The aryl in said arylalkenyl may be additionally substituted with halo, alkyl, alkoxy, haloalkyl and haloalkoxy.

The term "arylalkynyl group" encompasses aryl-substituted alkynyl groups. In embodiments, arylalkynyl groups are "lower arylalkynyl" groups having aryl groups attached to alkynyl groups having two to six carbon atoms. Examples of such groups include phenylethynyl. The aryl in said aralkyl may be additionally substituted with halo, alkyl, alkoxy, haloalkyl and haloalkoxy. The terms benzyl and phenylmethyl are interchangeable.

The term "alkylthio group" encompasses groups containing a linear or branched alkyl group, of one to ten carbon atoms, attached to a divalent sulfur atom. In certain embodiments, the lower alkylthio groups have one to three carbon atoms. An example of "alkylthio" is methylthio, ($CH_3S$—).

The term "alkylamino group" denotes amino groups which have been substituted with one alkyl group and with two alkyl groups, including terms "N-alkylamino" and "N,N-dialkylamino". In embodiments, alkylamino groups are "lower alkylamino" groups having one or two alkyl groups of one to six carbon atoms, attached to a nitrogen atom. In other embodiments, lower alkylamino groups have one to three carbon atoms. Suitable "alkylamino" groups may be mono or dialkylamino such as N-methylamino, N-ethylamino, N,N-dimethylamino, N,N-diethylamino and the like.

The term "arylamino group" denotes amino groups which have been substituted with one or two aryl groups, such as N-phenylamino. The "arylamino" groups may be further substituted on the aryl ring portion of the group.

The term "heteroarylamino" denotes amino groups which have been substituted with one or two heteroaryl groups, such as N-thienylamino. The "heteroarylamino" groups may be further substituted on the heteroaryl ring portion of the group.

The term "aralkylamino group" denotes amino groups which have been substituted with one or two aralkyl groups. In other embodiments, there are phenyl-$C_1$-$C_3$-alkylamino groups, such as N-benzylamino. The "aralkylamino" groups may be further substituted on the aryl ring portion of the group.

The term "alkylaminoalkylamino group" denotes alkylamino groups which have been substituted with one or two alkylamino groups. In embodiments, there are $C_1$-$C_3$-alkylamino-$C_1$-$C_3$-alkylamino groups.

The term "arylthio group" encompasses aryl groups of six to ten carbon atoms, attached to a divalent sulfur atom. An example of "arylthio" is phenylthio. The term "aralkylthio group" encompasses aralkyl groups as described above, attached to a divalent sulfur atom. In certain embodiments there are phenyl-$C_1$-$C_3$-alkylthio groups. An example of "aralkylthio" is benzylthio.

The term "aryloxy group" encompasses optionally substituted aryl groups, as defined above, attached to an oxygen atom. Examples of such groups include phenoxy.

The term "aralkoxy group" encompasses oxy-containing aralkyl groups attached through an oxygen atom to other groups. In certain embodiments, aralkoxy groups are "lower aralkoxy" groups having optionally substituted phenyl groups attached to lower alkoxy group as described above.

The term "cycloalkyl group" includes saturated carbocyclic groups. In certain embodiments, cycloalkyl groups include $C_3$-$C_6$ rings. In embodiments, there are compounds that include, cyclopentyl, cyclopropyl, and cyclohexyl.

The term "cycloalkenyl group" includes carbocyclic groups that have one or more carbon-carbon double bonds; conjugated or non-conjugated, or a combination thereof. "Cycloalkenyl" and "cycloalkyldienyl" compounds are included in the term "cycloalkenyl". In certain embodiments, cycloalkenyl groups include $C_3$-$C_6$ rings. Examples include cyclopentenyl, cyclopentadienyl, cyclohexenyl and cycloheptadienyl. The "cycloalkenyl" group may have 1 to 3 substituents such as lower alkyl, hydroxyl, halo, haloalkyl, nitro, cyano, alkoxy, lower alkylamino, and the like.

The term "suitable substituent", "substituent" or "substituted" used in conjunction with the groups described herein refers to a chemically acceptable group, i.e., a moiety that does not negate the therapeutic activity of the inventive compounds. It is understood that substituents and substitution patterns on the compounds described herein may be selected by one of ordinary skill in the art to provide compounds that are chemically stable and that can be readily synthesized by techniques known in the art, as well as those methods set forth below. If a substituent is itself substituted with more than one group, it is understood that these multiple groups may be on the same carbon/member atom or on different carbons/member atoms, as long as a stable structure results. Illustrative examples of some suitable substituents include, cycloalkyl, heterocyclyl, hydroxyalkyl, benzyl, carbonyl, halo, haloalkyl, perfluoroalkyl, perfluoroalkoxy, alkyl, alkenyl, alkynyl, hydroxy, oxo, mercapto, alkylthio, alkoxy, aryl or heteroaryl, aryloxy or heteroaryloxy, aralkyl or heteroaralkyl, aralkoxy or heteroaralkoxy, HO—(C=O)—, amido, amino, alkyl- and dialkylamino, cyano, nitro, carbamoyl, alkylcarbonyl, alkoxycarbonyl, alkylaminocarbonyl, dialkylaminocarbonyl, arylcarbonyl, aryloxycarbonyl, alkylsulfonyl, and arylsulfonyl. Typical substituents include aromatic groups, substituted aromatic groups, hydrocarbon groups including alkyl groups such as methyl groups, substituted hydrocarbon groups such as benzyl, and heterogeneous groups including alkoxy groups such as methoxy groups.

The term "fused" means in which two or more carbons/member atoms are common to two adjoining rings, e.g., the rings are "fused rings".

The salts of the compounds described herein include salts of the compounds as formed, e.g., from inorganic or organic acids, which in an aspect are non-toxic. For example, such salts include those derived from inorganic acids such as hydrochloric, hydrobromic, sulfuric, sulfamic, phosphoric, nitric and the like; and the salts prepared from organic acids such as acetic, propionic, succinic, glycolic, stearic, lactic, malic, tartaric, citric, ascorbic, pamoic, maleic, hydroxymaleic, phenylacetic, glutamic, benzoic, salicylic, sulfanilic, 2-acetoxy-benzoic, fumaric, toluenesulfonic, methanesulfonic, ethane disulfonic, oxalic, isethionic, trifluoroacetic and the like.

The salts of the compounds described herein can be synthesized from the compounds described herein which contain a basic or acidic moiety by conventional chemical methods. Generally, the salts of the basic compounds are prepared either by ion exchange chromatography or by reacting the free base with stoichiometric amounts or with an excess of the desired salt-forming inorganic or organic acid in a suitable solvent or various combinations of solvents. Similarly, the salts of the acidic compounds are formed by reactions with the appropriate inorganic or organic base.

Included herein are salts, solvates, and prodrugs of the compounds described herein and mixtures thereof.

In understanding the scope of the present application, the articles "a", "an", "the", and "said" are intended to mean that there are one or more of the elements. Additionally, the term "comprising" and its derivatives, as used herein, are intended to be open ended terms that specify the presence of the stated features, elements, components, groups, integers, and/or steps, but do not exclude the presence of other unstated features, elements, components, groups, integers and/or steps. The foregoing also applies to words having similar meanings such as the terms, "including", "having" and their derivatives.

It will be understood that any aspects described as "comprising" certain components may also "consist of or "consist essentially of," (or vice versa) wherein "consisting of" has a closed-ended or restrictive meaning and "consisting essentially of" means including the components specified but excluding other components except for materials present as impurities, unavoidable materials present as a result of processes used to provide the components, and components added for a purpose other than achieving the technical effect described herein. For example, a composition defined using the phrase "consisting essentially of" encompasses any known pharmaceutically acceptable additive, excipient, diluent, carrier, and the like. Typically, a composition consisting essentially of a set of components will comprise less than 5% by weight, typically less than 3% by weight, more typically less than 1% by weight of non-specified components.

It will be understood that any component defined herein as being included may be explicitly excluded by way of proviso or negative limitation, such as any specific compounds whether implicitly or explicitly defined herein.

In addition, all ranges given herein include the end of the ranges and also any intermediate range points, whether explicitly stated or not.

Finally, terms of degree such as "substantially", "about" and "approximately" as used herein mean a reasonable amount of deviation of the modified term such that the end result is not significantly changed. These terms of degree should be construed as including a deviation of at least ±5% of the modified term if this deviation would not negate the meaning of the word it modifies.

Complexes

The organometallic complex $[Cd(C_4H_4N_3)(C_2H_3O_2)_2 (H_2O)]_n$ is an infinite 1D coordination polymer made up of $Cd^{2+}$ transition metal ions spaced by 7.5660(4) Å through an aminopyrazine (FIG. 1). Each $Cd^{2+}$ center is seven-coordinated by two nitrogens from two bidentate aminopyrazine molecules, four oxygens from two bidentate acetate anions and one oxygen atom from one water molecule. Its coordination geometry can be described as somewhat distorted pentagonal bipyramidal, with oxygens forming the distorted basal plane [root-mean square deviation (RMSD) from the least-square plane calculated through them of 0.272 Å] and the nitrogens occupying the axial positions. Therefore, acetate anions are almost perpendicular to aminopyrazine. The angles between theft mean planes range from 83.38 (17°) to 86.14(18°). The bond angles O—Cd—O around the metal ion range from 83.66(9°) to 86.24(9°) while the N—Cd—N angle measures 175.33(12°). The Cd—$O_{acet}$ coordination bonds range between 2.360(2) Å and 2.464(2) Å, while the Cd-0, coordination bond measures 2.273(3) Å. The Cd—$N_{ampy2}$ coordination bonds measure 2.398(3) Å.

As aforementioned, this complex can be described as a polymeric structure formed by $[Cd(C_4H_4N_3)(C_2H_3O_2)_2 (H_2O)]n$ units, which can be expanded by means of the Cd—N coordination bond (FIG. 1). Furthermore, all hydrogen bonding functionalities are saturated in this structure. There is a classical intramolecular hydrogen bond between the amine group and one acetate anion. The amine group is also an intermolecular hydrogen bonding donor to another acetate anion from a neighboring chain packed perpendicular to the [010] with a rise of 2.15 Å normal to the [201] (FIG. 1). Even though the amine group is disordered over two occupancy site sets, both of them have the same contact pattern with slight differences in their metrics, which is reflected in their similar refined site occupancy factors (52.0(2)% and 48.0(2)%). Polymeric chains packed perpendicular to the [010] are also strongly kept in contact through hydrogen bonds between water and acetate ligands, which propagate infinitely along the [001] (FIG. 1). These two patterns of intermolecular hydrogen bonds bearing either amine or water as donors to acetate ligands alternate perpendicularly to the [010] and give rise to a 3D network of strongly hydrogen bonded polymeric chains.

Thus, described herein is a coordination complex of Formula (I):

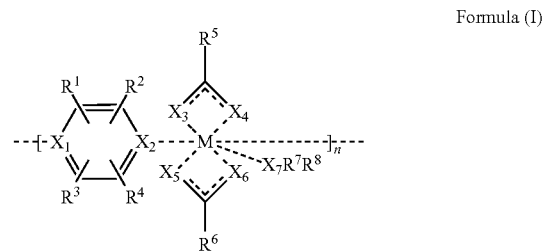

Formula (I)

In Formula I, -------- is a coordinate bond; M is a metal; $X_1$, X2, X3, X4, X5, $X_6$, and $X_7$ are each independently selected from a heteroatom; $R^1$, $R^2$, $R^3$, $R^4$, $R^7$, and $R^5$ are each independently selected from H and a saturated or unsaturated, substituted or unsubstituted, cyclic or linear hydrocarbon comprising from 1 to 8 carbon atoms; $R^5$ and $R^6$ are each independently selected from H and a saturated or unsaturated, substituted or unsubstituted, cyclic or linear hydrocarbon comprising from 1 to 8 carbon atoms; and n is an integer.

Typically, M is a metal selected from the group consisting of Zn, Cd, Hg, and a transition metal with 2 valence electrons and, more typically, M is Cd.

Typically, at least one of $X_1$ and $X_2$ is N and, more typically, $X_1$ and $X_2$ are both N.

In typical aspects, $X_3$, $X_4$, $X_5$, $X_6$, and $X_7$ are each independently selected from the group consisting of O, S, and Se. For example, in certain aspects, at least one of $X_3$, $X_4$, $X_5$, $X_6$, and $X_7$ is O. In aspects, $X_3$, X4, X5, X6, and $X_7$ are the same and thus, in certain aspects, each of $X_3$, X4, X5, $X_6$, and $X_7$ is O.

Typically, at least one of $R^1$, $R^2$, $R^3$, $R^4$ 1s $NH_2$. In certain aspects, one of $R^1$, $R^2$, $R^3$, $R^4$ is $NH_2$ and three of $R^1$, $R^2$, $R^3$, $R^4$ are H. The $NH_2$ may be disordered over two occupancy sites, typically with an occupancy factor of about 50%.

In typical aspects, at least one of $R^5$ and $R^6$ is $CH_3$ and, in other aspects, $R^5$ and $R^6$ are both $CH_3$.

Typically, at least one of $R^7$ and $R^5$ is H and, in other aspects, $R^7$ and $R^5$ are both H.

In certain aspects, n is 1. In other aspects, n is from about 1 to about 100, such as from about 1 to about 75, such as from about 1 to about 50, such as from about 1 to about 25, such as from about 1 to about 20, such as from about 1, 2, 3, 4, 5, 6, 7, 8, 9, 10, 11, 12, 13, 14, 15, 16, 17, 18, or 19 to about 2, 3, 4, 5, 6, 7, 8, 9, 10, 11, 12, 13, 14, 15, 16, 17, 18, 19, or 20.

In particular aspects, the coordination complex is of Formula (II):

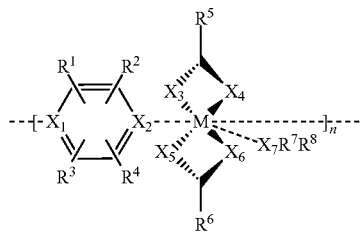

Formula (II)

In other particular aspects, the coordination complex is of Formula (III):

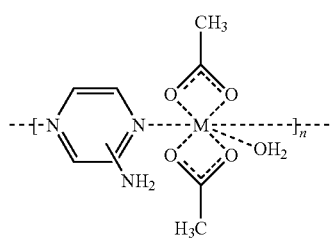

Formula (III)

In other particular aspects, the coordination complex comprises the formula $[Cd(C_4H_5N_3)(C_2H_3O_2)_2(H_2O)]_n$, wherein n is an integer, for example, the coordination complex may comprise the formula [Cd(aminopyrazine)(acetate)$_2$(H$_2$O)]$_n$.

As will be understood, the coordination complex described herein may comprise a central metal atom coordinated by a nitrogen atom of aminopyrazine, two bidentate ligands, and an oxygen atom of water. The bidentate ligands may be selected from formate and acetate and, optionally, at least one oxygen atom may be substituted with S or Se.

Coordination Polymers and Crystalline Compounds

The coordination complexes described herein may be polymerized to result in a coordination polymer. The coordination polymer typically forms a one-dimensional polymer chain.

Typically, the coordination polymers form a crystalline compound. The crystalline compound is typically of the structure as seen in FIG. 1(C).

Further described herein is a blue emitting crystal form based on a cadmium coordination polymer comprising an external quantum efficiency of greater than 70%.

Figure 9:
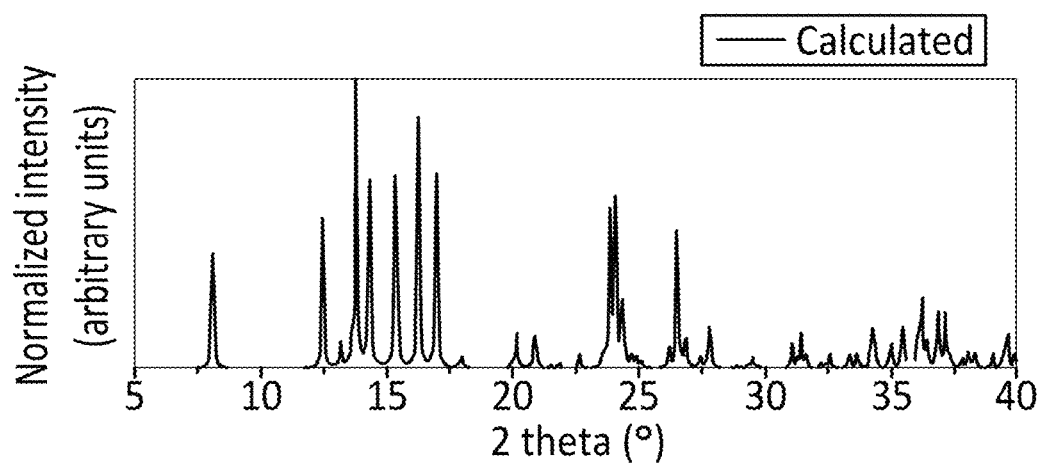
FIG. 9 shows a powder X-ray diffraction pattern of a crystalline compound as provided by the present invention.

Also described herein is a crystalline compound comprising the powder X-ray diffraction pattern as seen in FIG. 9.

The crystalline compound described herein may also be defined in terms of its x-ray diffraction peaks. For example, the crystalline compound described herein may have x-ray diffraction peaks at the following 2 θ positions, within a ±0.200° range: (peaks with normalized intensities equal or higher than 10% are listed):

| | | | | |
|---|---|---|---|---|
| 8.105; | 14.327; | 20.127: | 26.546; | 36.233; |
| 12.474; | 15.347; | 23.857; | 34.253; | 36.868; |
| 13.184; | 16.251; | 24.068; | 35.462; | 37.148; |
| 13.797; | 16.979; | 24.327; | 36.063; | 39.641. |

OLED Devices

The compounds described herein are particularly useful in a light-emitting layer of OLED technology. To this regard, the compounds can be employed in many OLED device configurations using small molecule materials, oligomeric materials, polymeric materials, or combinations thereof. These include very simple structures comprising a single anode and cathode to more complex devices, such as passive matrix displays comprised of orthogonal arrays of anodes and cathodes to form pixels, and active-matrix displays where each pixel is controlled independently, for example, with thin film transistors (TFTs).

There are numerous configurations of the organic layers wherein the compounds described herein can be successfully practiced. Typical OLEDs require an anode, a cathode, and an organic light-emitting layer located between the anode and cathode. Additional layers may be employed as will be understood by a skilled person.

For example, a typical OLED is comprised of a substrate, an anode, a hole-injecting layer, a hole-transporting layer, a light-emitting layer, a hole- or exciton-blocking layer, an electron-transporting layer, and a cathode. Typically, an exciton-blocking layer on the anode side of the light-emitting layer and/or a hole-blocking layer on the cathode side of the light emitting layer are included as well. These layers are described in more detail below. Note that the substrate may alternatively be located adjacent to the cathode, or the substrate may actually constitute the anode or cathode. The organic layers between the anode and cathode are conveniently referred to as the organic EL element. Also, the total combined thickness of the organic layers is typically less than 500 nm.

Typically, the anode and cathode of the OLED are connected to a voltage/current source through electrical conductors. The OLED is operated by applying a potential between the anode and cathode such that the anode is at a more positive potential than the cathode. Holes are injected into the organic EL element from the anode and electrons are injected into the organic EL element at the cathode. Enhanced device stability can sometimes be achieved when the OLED is operated in an AC mode where, for some time period in the cycle, the potential bias is reversed and no current flows.

Other Uses

The compounds described herein have been identified as being particularly useful, in aspects, in OLED devices. However, it will be understood that these compounds may be used in any manner in which conventional UV-activated compounds are used.

In other aspects, the compounds described herein find use as a research tool, in diagnostics, in various items such as toys, dolls, card games, paints, textiles, balloons, cosmetics, and foodstuffs or any other article or composition designed to glow illuminated with light of an appropriate wavelength. In such aspects, the compounds described herein may be used as a monomer or an oligomer. Such an oligomer may have from about 2 to about 20 monomer units, such as from about, 2, 3, 4, 5, 6, 7, 8, 9, 10, 11, 12, 13, 14, 15, 16, 17, 18, or 19 monomer units to about 3, 4, 5, 6, 7, 8, 9, 10, 11, 12, 13, 14, 15, 16, 17, 18, 19, or 20 monomer units.

For example, the compounds described herein in aspects may be used in novelty items designed for entertainment, recreation and amusement, and include, but are not limited to: toys, such as squirt guns, toy cigarettes, toy "Halloween" eggs, footbags and board/card games; finger paints and other paints, slimy play material; textiles, such as clothing, such as shirts, hats and sports gear suits, threads and yarns; bubbles in bubble making toys and other toys that produce bubbles; balloons; figurines; personal items, such as cosmetics, bath powders, body lotions, gels, powders and creams, nail polishes, make-up, hair colorants or hair conditioners, mousses or other such products, toothpastes and other dentifrices, soaps, body paints, and bubble bath; items such as inks, paper; foods, such as gelatins, icings and frostings; fish food; plant food; and beverages, such as beer, wine, champagne, soft drinks, and ice cubes and ice in other configurations; fountains, including liquid "fireworks" and other such jets or sprays or aerosols of compositions that are solutions, mixtures, suspensions, powders, pastes, particles or other suitable form.

Any article of manufacture that can be combined with a light-emitting compounds described herein and thereby provide entertainment, recreation and/or amusement, including use of the items for recreation or to attract attention, such as for advertising goods and/or services that are associated with a logo or trademark is contemplated herein. Such uses may be in addition to or in conjunction with or in place of the ordinary or normal use of such items. As a result of the combination, the items glow or produce, such as in the case of squirt guns and fountains, a glowing fluid or spray of liquid or particles in the presence of UV light. The novelty in the novelty item in aspects derives from its light emission.

The compounds described herein, in aspects, can also be used as a fluorescent material in the production of compact fluorescent lamps or in the production of devices that use fluorescent lamps as well as a substitute fluorescent material in other types of lamps in which conventional UV-activated compounds are used.

Methods for diagnosis and visualization of tissues in vivo or in situ using compositions containing the compounds described herein are also contemplated in aspects. For example, the compounds described herein can, in aspects, be used in conjunction with diagnostic systems that rely on fluorescence for visualizing tissues in situ. Such systems are typically useful for visualizing and detecting neoplastic tissue and specialty tissue, such as during non-invasive and invasive procedures.

The systems typically include compositions containing conjugates that include a tissue specific, such as a tumor-specific, targeting agent linked to one or more than one compound described herein. In other aspects, tissue-specific targeting agents are linked to microcarriers that are coupled with, one or more than one compound described herein. The compounds may be linked directly to a peptide, such as an antibody or antigen, or may be linked through use of a functional agent or bifunctional agent.

Thus, in aspects, compounds described herein may be fused or otherwise coupled to antibodies directed to target tissues in plants or animals. For example, it may be desirable to label tumors in animals and to follow metastases by coupling the compound described herein to cells within the tumor. The compounds described herein may be prepared as conjugates with moieties which are able to target tissues or cells. Typical targeting moieties are specific binding partners for a material displayed on tissues or cells. Typical targeting moieties are antibodies and ligands for receptors.

The compounds described herein may also be used to label reagents in assays such as immunoassays. In one example, a sandwich assay may be employed wherein one specific binding partner to an analyte is a capture moiety which immobilizes the analyte and a second specific binding partner is used to label the immobilized analyte. The compounds described herein may be used directly as a label on the labeling binding partner or on a secondary binding partner such as, for example, the use of a second antibody-bearing label to couple to a first antibody directly bound to analyte.

In other aspects, methods for diagnosing diseases, particularly infectious diseases, using chip methodology involving the compounds described herein are provided. In particular, the chip typically includes an integrated photo-detector that detects the photons emitted by the fluorescence-generating system. In one aspect, the chip is made using an integrated circuit with an array, such as an X-Y array, of photodetectors. The surface of the circuit is treated to render it inert to conditions of the diagnostic assays for which the chip is intended, and is adapted, such as by derivatization for linking molecules, such as antibodies. A selected antibody or panel of antibodies, such as an antibody specific for a bacterial antigen, is affixed to the surface of the chip above each photodetector. After contacting the chip with a test sample, the chip is contacted with a second antibody linked to a compound described herein. If any of the antibodies linked to a component of a fluorescence-generating system are present on the chip, light will be generated and detected by the photodetector. The photodetector is operatively linked to a computer, which is programmed with information identifying the linked antibodies, records the event, and thereby identifies antigens present in the test sample.

Other assays using the compounds described herein are also contemplated. Any assay or diagnostic method known used by those of skill in the art that employs fluorescent molecules is contemplated herein.

Thus, antibodies or peptides conjugated to the compounds described herein are also provided. These antibodies, monoclonal or polyclonal, and peptides can be prepared employing standard techniques, known to those of skill in the art.

In other aspects, the compounds described herein can be transformed into nanoparticles through milling processes and/or can be functionalized with different organic binders in order to improve interactions of the cadmium atoms with the cells in biological applications.

The milling process to produce nanoparticles may use grinding media to form milled particle compositions having desired characteristics (e.g., small particle size, shape, low contamination level). In some aspects, the particles may be coated with a coating that may enhance certain properties of the particle composition (e.g., light emission). A coating material precursor can be milled along with feed material particles under desired conditions to form the coatings on the particles.

It should be understood that the particle sizes described herein may be for coated or uncoated lithium-based compound particle compositions. To this regard, the typical average particle size of the particle compositions typically depends on the intended application. In certain applications, it may be desired for the average particle size to be extremely small (e.g., less than 100 nm); while, in other applications, it may be desired for the average particle size to be slightly larger (e.g., between 100 nm and 500 nm). In general, milling parameters may be controlled to provide a desired particle size, though in certain cases it may be preferable for the average particle size to be greater than 1 nm to facilitate miffing. For example, the average particle size of the milled material may be controlled by a number of factors including grinding media characteristics (e.g., density, size, hardness, toughness), as well as milling conditions (e.g., specific energy input).

The "average particle size" of a particle composition is the numeric average of the "particle size" of a representative number of primary particles (non-agglomerated) in the composition. The "particle size" of a primary particle (non-agglomerated) is its maximum cross-sectional dimension taken along an x, y, or z-axis. For example, the maximum cross-sectional diameter of a substantially spherical particle is its diameter. Particle sizes can be determined using microscopy techniques, such as scanning electron microscope or transmission electron microscope techniques.

It should also be understood that particle compositions having average particle sizes outside the above-described ranges (e.g., greater than 500 nm) may be useful in certain aspects.

The particle compositions may also be relatively free of large particles. That is, the particle compositions may include only a small concentration of larger particles. For example, the $D_{90}$ values for the compositions may include, but are not limited to, any of the above-described average particle sizes.

The particle compositions may also have a very high average surface area. The high surface area is, in part, due to the very small particle sizes noted above. The average surface area of the particle compositions may be greater than 1 $m^2/g$; in other cases, greater than 5 $m^2/g$; and, in other cases, greater than 50 $m^2/g$. In some cases, the particles may have extremely high average surface areas of greater than 100 $m^2/g$; or, even greater than 500 $m^2/g$. It should be understood that these high average surface areas are even achievable in particles that are non-coated and/or substantially non-porous, though other particles may have surface pores. Surface area may be measured using conventional BET measurements. Such high surface areas may be obtained, in part, by using certain grinding media, as would be understood by a skilled person.

Similar to particle size, the preferred average surface area of the particle composition typically depends on the intended application. In certain applications, it may be desired for the average surface area to be extremely large (e.g., greater than 50 $m^2/g$, or greater than 260 $m^2/g$); while, in other applications, it may be desired for the average surface area to be slightly smaller (e.g., between 50 $m^2/g$ and 1 $m^2/g$). In general, milling parameters may be controlled to provide a desired surface area, though in certain cases it may be preferable for the average surface area to be less than 3,000 $m^2/g$ (e.g., for substantially non-porous particles). For example, the average surface area of the milled particle compositions may be controlled by a number of factors including grinding media characteristics (e.g., density, size, hardness, toughness), as well as milling conditions (e.g., energy, time).

It will be understood that the compounds described herein may be used in addition to other light emitting systems, such as bioluminescence or fluorescence, to enhance or create an array of different colors. For example, they may be used in combinations such that the color of, for example, a beverage changes over time, or includes layers of different colors.

It will be understood that any compounds or compositions described herein for medical, diagnostic, topical, or ingestible use should be pharmaceutically acceptable and therefore nontoxic and safe to apply to the area in which it is intended, such as the skin, hair, and/or eyes and/or to ingest.

The foregoing applications are merely exemplary. In general, the compounds described herein can be used in any application where fluorescent labels are employed, including assay modifications such as fluorescence polarization and fluorescence quenching assays, flow cytometry, fluorescence activated cell sorting, immunofluorescence assays, and point of care devices.

Kits

Kits containing the compounds described herein for use in the methods, including those described herein, are provided. In one aspect, kits containing an article of manufacture and appropriate reagents for generating fluorescence are provided. In aspects, the kits contain soap compositions, with typically a moderate pH, such as between about 5 and about 8, and a UV light source, such as a black light, are provided herein. These kits, for example, can be used with a bubble-blowing or producing toy. These kits can also include a reloading or charging cartridge or can be used in connection with a food.

In another aspect, the kits are used for detecting and visualizing neoplastic tissue and other tissues and include a composition that contains the compound described herein.

The compounds described herein may be "ready-to-use" or they may be in prodrug form, requiring an activating agent in order to emit light in response to UV excitation. Thus, in aspects, these kits may include two compositions, a first composition containing the compound formulated for systemic administration (or in some aspects local or topical application), and a second composition containing the component or components required to render the compound reactive to UV Light. Instructions for administration will be included in aspects.

In other aspects, the kits are used for detecting and identifying diseases, particularly infectious diseases, for example by using multi-well assay devices and include a multi-well assay device containing a plurality of wells, each having an integrated photodetector, to which an antibody or panel of antibodies specific for one or more infectious agents are attached, and a composition containing a secondary antibody, such as an antibody specific for the infectious agent that is linked to a compound described herein, which, in the presence of UV light, emits blue light that is detected by the photodetector of the device to indicate the presence of the infectious agent.

The above disclosure generally describes the present invention. A more complete understanding can be obtained by reference to the following specific Examples. These Examples are described solely for purposes of illustration and are not intended to limit the scope of the invention. Changes in form and substitution of equivalents are contemplated as circumstances may suggest or render expedient. Although specific terms have been employed herein, such terms are intended in a descriptive sense and not for purposes of limitation.

EXAMPLES

Example 1—Synthesis of Complex

About 41.2 mg of aminopyrazine was dissolved in 10 ml of ethyl alcohol at room temperature and the mixture was stirred until it was completely dissolved. Meanwhile, 20.4 mg of doped cadmium (II) acetate was dissolved in 10 ml of distilled water. Subsequently, the two solutions were mixed and held at 25° C. until the solvent evaporated, resulting in a crystalline solid identified as complex 1.

All reflections data were collected on an APEX II CCD detector of a Bruker-AXS Kappa Duo diffractometer using MoKα radiation from an 1 μS microsource with multilayer optics. The structure was solved by direct methods of phase retrieval and then refined by full-matrix least squares on $F^2$ with anisotropic thermal parameters for all non-hydrogen atoms while the hydrogen atoms had their displacement parameters fixed and set to isotropic ($U_{iso}$(H)=1.2 $U_{eq}$(CH or NH$_2$) or 1.5 $U_{eq}$(water or CH$_3$). The hydrogen positions were either calculated and constrained following a riding model or located from the difference Fourier map and then fixed (water hydrogens only). Also, the NH$_2$ group was found to be disordered over two sites sets whose nitrogen occupancies were refined freely and then imposed to their corresponding hydrogens.

Using a powder X-ray diffraction technique, it was confirmed that complex 1 was quantitatively synthesized, i. e., near 100% yield, as a substantially pure monophasic crystalline solid, with negligible crystalline or amorphous impurities such as side products or non-consumed reagents. This was determined through the superimposition of all observed diffraction peaks to corresponding ones predicted by the elucidated single crystal structure.

Example 2—Fluorescence Spectrum and Complex Quantum Yield

The fluorescence emission spectrum for the solid sample of complex 1 was measured using a Fluorolog FL3-221 Horiba Jobin-Yvon fluorimeter. Measurements were made of the excitation spectrum of this sample in the 200 to 280 nm range and the emission spectrum of 280 to 700 nm. The solid sample was glued to the support and positioned at 45° to the front-side cell.

For the quantum yield calculations, the average of three excitation spectrum readings of the complex 1 sample in the 276 nm range and the 400 nm emission was averaged. Subsequently, the area of the spectrum curve obtained using the software of the fluorimeter itself was calculated. The quantum yield measurements were taken from the light absorption measurements of the samples and luminescence emission measurements of the standards and samples. The internal quantum yield of the sample (flint) was determined by comparison with the quantum yield of the barium sulfate used as standard, according to the equation below:

$$\varphi_{int}=(E_2-E_1)/(R_1-R_2)$$

where:
R1=Area of absorption spectrum curve of BaSO$_4$ sample;
R2=Curve area of the absorption spectrum of the complex 1 sample;
E1=Area of the sample emission curve of BaSO$_4$; and
E2=Area of the emission spectrum curve of the complex 1 sample.

Example 3—Photoluminescence Emission Spectrum

Photoluminscence (PL) measurements were recorded using a double monochromator and a Hamamatsu photomultiplier tube as detector (Fluorolog FL3-221 from Horiba Jobin-Yvon), under excitation from a Xe arc lamp delivering 450 W. To this equipment, was coupled by means optical fibers, an integrating sphere (Quanta-Q from Horiba Jobin-Yvon) of Spectralon™. The excitation reflectance and emission spectra were collected, using the entrance and exit slits fixed at 0.8 nm bandpass, and each emission spectra point was collected at each 1.0 nm. The IQE, EQE, and emission color coordinates values were determined by means of the FluorEssence V3.5 software, furnished with the Fluorolog FL3-221 spectrofluorimeter and Quanta-cp integrating sphere from Horiba Jobin-Yvon.

Photoluminescence excitation and emission spectra were recorded using a double monochromator and a Hamamatsu photomultiplier tube as detector (Fluorolog FL3-221 from Horiba Jobin-Yvon), under excitations from a Xe arc lamp delivering 450 W. The bandpass was fixed at 0.7 nm, and each point was collected at each 0.7 nm. The emission color coordinates were determined using the experimental setup based on the PL emission spectra recorded by an integrating sphere and the software FluorEssence V 3.5 furnished with the spectrofluorimeter (Fluorolog FL3-221, Horiba Jobin-Yvon).

Figure 5:
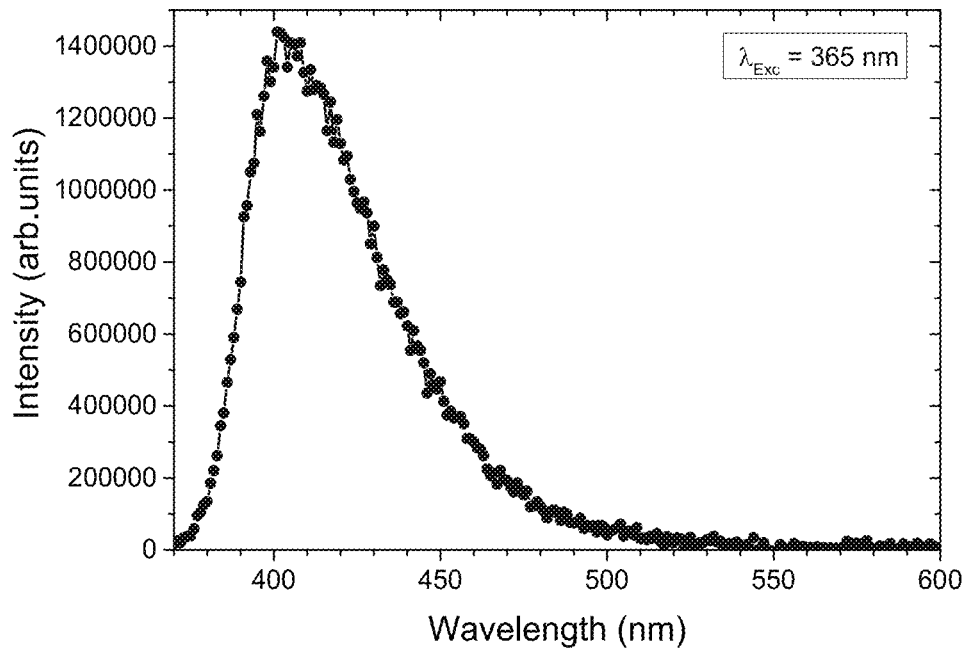
FIG. 5 (A) shows a photoluminescence emission spectrum of the $[Cd(C_4H_4N_3)(C_2H_3O_2)_2(H_2O)]_n$ crystals under excitation at 365 nm.
Figure 5:
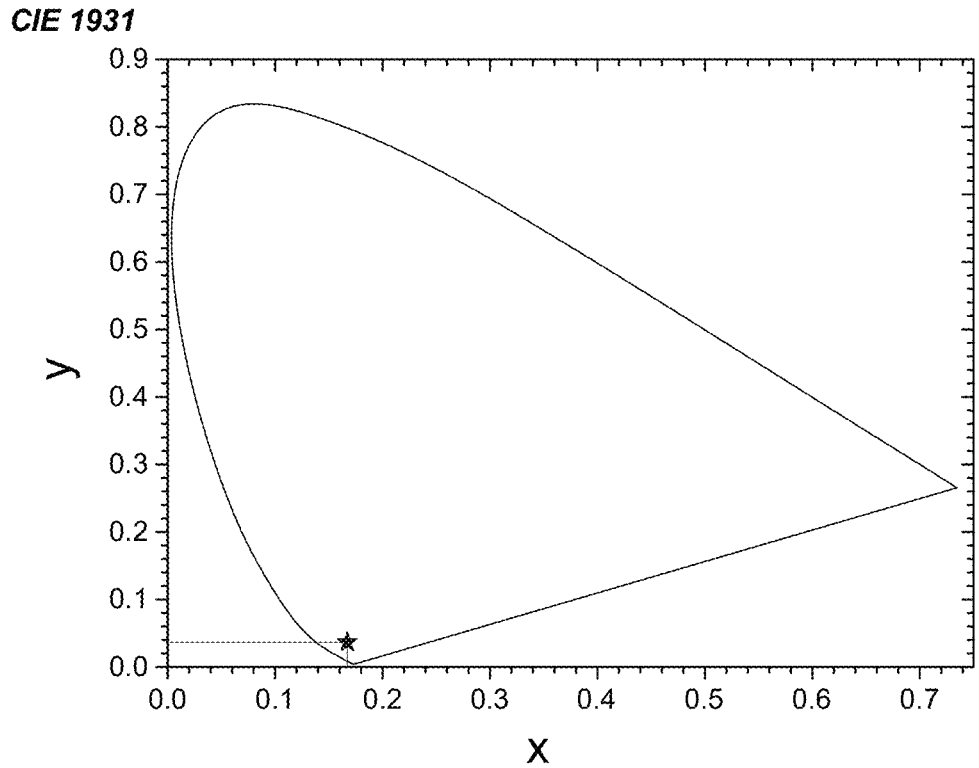

In FIG. 5(a), the photoluminescence (PL) emission spectrum is presented under an excitation wavelength of 365 nm. The excitation spectrum was acquired monitoring the emission at 410 nm, which resulted in a broad band emission between 370 nm and 520 nm (ultraviolet, violet, blue and green emissions), with the maximum at 410 nm corresponding to deep-blue color (colorimetric coordinates x=0.167 and y=0.037; for blue color x=0.17 and y=0.00). The colorimetric coordinates of our sample were included in the CIE 1931 chromaticity diagram of the FIG. 5(b).

An impressive EQE of 75.4(9)% was observed with a corresponding IQE of 77.7(9)%. To the best of our knowledge, an EQE of approximately 64% has been achieved for green phosphorescent OLEDs,[23] while this value attained 37% for blue thermally activated delayed fluorescence (TADF) OLEDs.[16]

Thus described herein is a solid state material with the highest energy conversion rate from UV to visible light known thus far. The next steps will consist of fabricating high-performance blue OLED devices with this crystal form.

Example 4—Naked Eye Visible Light Emission

Figure 6:
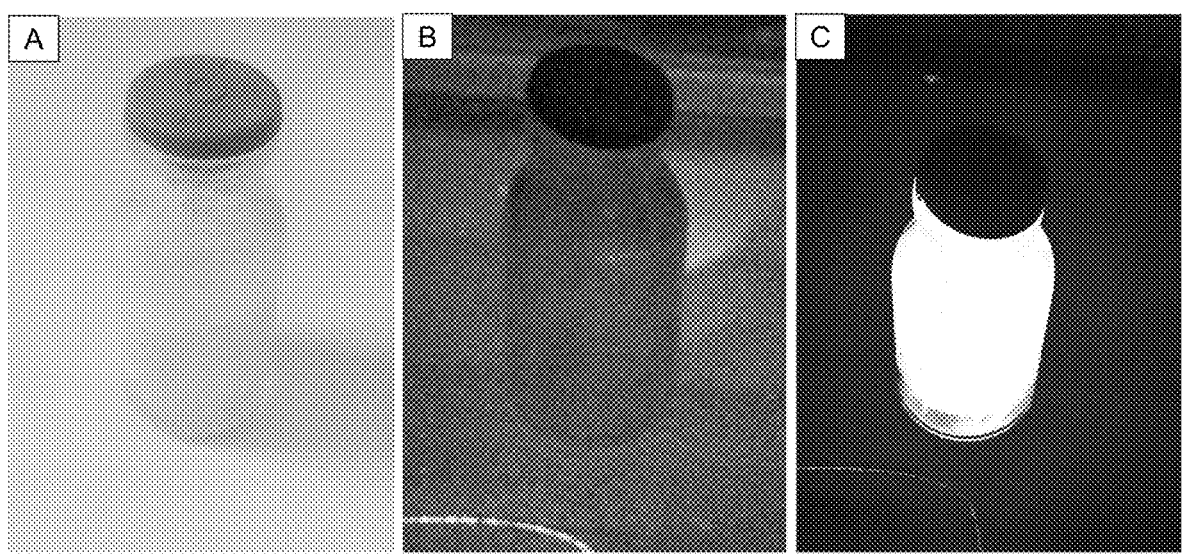
FIG. 6 (B) shows CIE 1931 color coordinates of the PL emission, represented by the blue star symbol.

About 13.7 mg of aminopyrazine was dissolved in 3 ml of ethyl alcohol at room temperature and the mixture was stirred until it was completely dissolved. Meanwhile, 6.8 mg of doped cadmium (II) acetate was dissolved in 10 ml of distilled water. Subsequently, the two solutions were mixed. The mixture was transfer to a glass flask and held at 25° C. until the solvent evaporated. The flask containing the crystals was then place under UVA light (wavelength 365 nm, 6 W). A clear blue light was visible to the naked eye, as shown in FIGS. 6a, 6b, and 6c.

Example 5—Naked Eye Visible Light Emission—Solubilization

Figure 7:
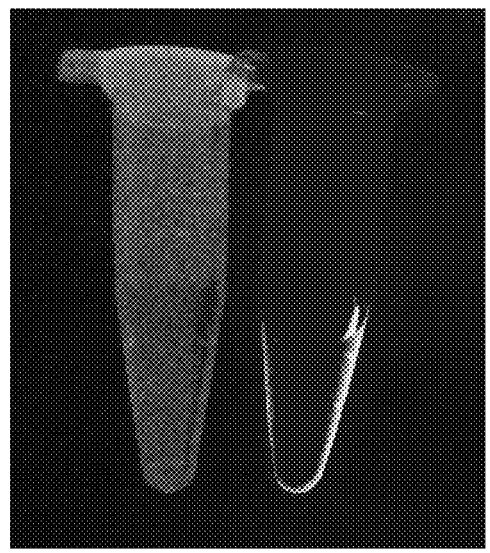
FIG. 7 (A) shows a photograph of 5 mg of the cadmium (11)-based complex diluted in 1 mL of water (right). The left microtube was used as a control and contained only distilled water.
Figure 7:
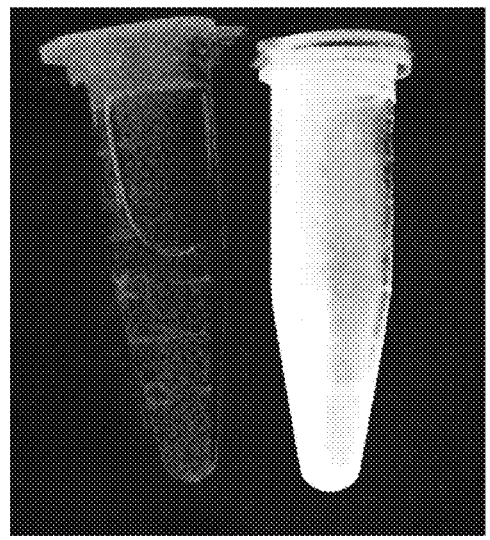

About 5 mg of complex 1 was diluted in 1 mL of distilled water or 96% ethanol. After 5 min under agitation the vials containing the solubilized compounds (water or ethanol) were place under a UVA light (wavelength 365 nm, 6 W). A control vial containing only the solvent was used as a control. A clear blue light was visible to the naked eye. FIG. 7a shows complex 1 dissolved in water and FIG. 7b shows complex 1 dissolved in ethanol).

Figure 8:
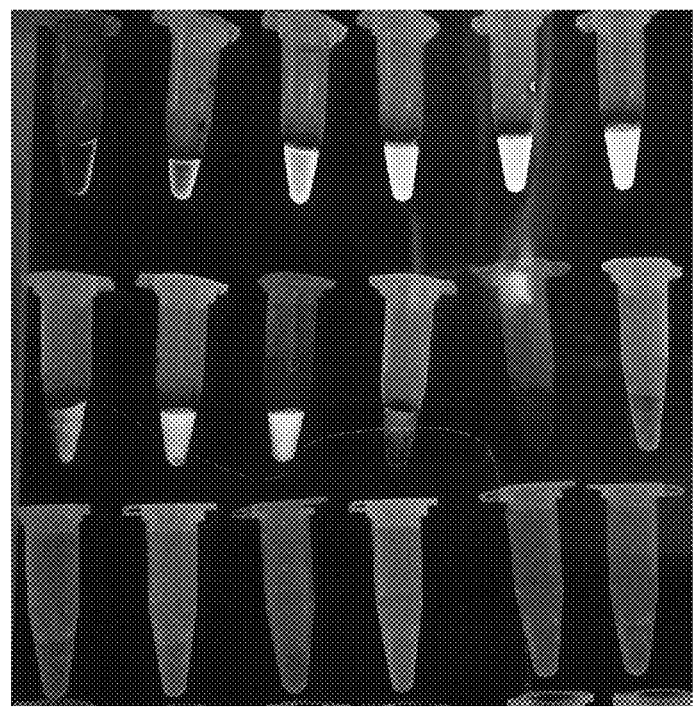
FIG. 8 shows serial dilution of the cadmium (11)-based complex in water (1:2 up to 1:262144) under a UVA light (wavelength 365 nm, 6 W).

Example 6—Naked Eye Visible Light Emission—Solubilization Using Limiting Dilution About 5 mg of complex 1 was diluted in 1 mL of distilled water. After 5 min under agitation, the solubilized complex was serially diluted with water as shown in Table 1 below. After dilution, the microtubes containing the diluted complex were place under a UVA light (wavelength 365 nm, 6 W) as shown in FIG. 8.

TABLE 1

Serial dilution of complex 1.

| Dilution Factor | pg/mL | Dilution Factor | pg/mL |
|---|---|---|---|
| 2 | 2500.00 | 1024 | 4.88 |
| 4 | 1250.00 | 2048 | 2.44 |
| 8 | 625.00 | 4096 | 1.22 |
| 16 | 312.50 | 8192 | 0.61 |
| 32 | 156.25 | 16384 | 0.31 |
| 64 | 78.13 | 32768 | 0.15 |
| 128 | 39.06 | 65536 | 0.08 |
| 256 | 19.53 | 131072 | 0.04 |
| 512 | 9.77 | 262144 | 0.02 |

The above disclosure generally describes the present invention. Although specific terms have been employed herein, such terms are intended in a descriptive sense and not for purposes of limitation.

All publications, patents and patent applications cited herein are hereby incorporated by reference in their entirety to the same extent as if each individual publication, patent or patent application was specifically and individually indicated to be incorporated by reference in its entirety.

Although preferred embodiments of the invention have been described herein in detail, it will be understood by those skilled in the art that variations may be made thereto without departing from the spirit of the invention or the scope of the appended claims.

The invention claimed is:

1. A coordination complex of Formula (I):

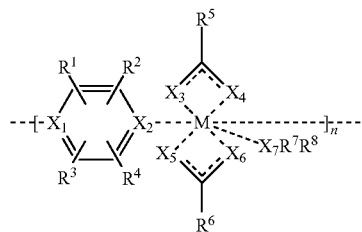

Formula (I)

wherein ---------- is a coordinate bond;
where M is a metal;
$X_1$, $X_2$, $X_3$, $X_4$, $X_5$, $X_6$, and $X_7$ are each independently selected from a heteroatom;
$R^1$, $R^2$, $R^3$, $R^4$, $R^7$, and $R^8$ are each independently selected from H and a saturated or unsaturated, substituted or unsubstituted, cyclic or linear hydrocarbon comprising from 1 to 8 carbon atoms, wherein at least one of $R^1$, $R^2$, $R^3$, and $R^4$ is $NH_2$;
$R^5$ and $R^6$ are each independently selected from H and a saturated or unsaturated, substituted or unsubstituted, cyclic or linear hydrocarbon comprising from 1 to 8 carbon atoms, wherein at least one of $R^5$ and $R^6$ is $CH_3$; and
n is an integer of at least 1.

2. The coordination complex of claim 1, wherein M is a metal selected from the group consisting of Zn, Cd, Hg, and a transition metal with 2 valence electrons.

3. The coordination complex of claim 2, wherein M is Cd.

4. The coordination complex of claim 1, wherein $X_1$ and $X_2$ are both N.

5. The coordination complex of claim 1, wherein $X_3$, $X_4$, $X_5$, $X_6$, and $X_7$ are each independently selected from the group consisting of O, S, and Se.

6. The coordination complex of claim 5, wherein each of $X_3$, $X_4$, $X_5$, $X_6$, and $X_7$ is O.

7. The coordination complex of claim 1, wherein one of $R^1$, $R^2$, $R^3$, or $R^4$, is $NH_2$ and three of $R^1$, $R^2$, $R^3$, and $R^4$ is H.

8. The coordination complex of claim 7, wherein the $NH_2$ is disordered over two occupancy sites with an occupancy factor of about 50%.

9. The coordination complex of claim 1, wherein $R^4$ and $R^5$ are both $CH_3$.

10. The coordination complex of claim 1, wherein $R^7$ and $R^8$ are both H.

11. The coordination complex of claim 1, wherein n is from about 1 to about 100.

12. The coordination complex of claim 1, of

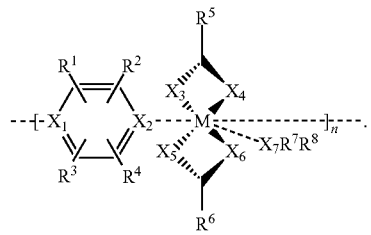

Formula (II)

13. The coordination complex of claim 1 of Formula (III):

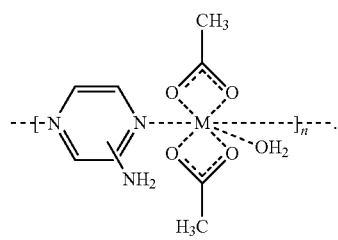

Formula (III)

14. A coordination complex comprising the formula [Cd$(C_4H_5N_3)(C_2H_3O_2)_2(H_2O)]_n$, wherein n is an integer of at least 1.

15. The coordination complex of claim 14, wherein n is from about 1 to about 100.

16. The coordination complex of claim 1, comprising the formula [Cd(aminopyrazine)(acetate)$_2$(H$_2$O)]$_n$, wherein n is an integer of at least 1.

17. A coordination polymer comprising the coordination complex of claim 1.

18. The polymer of claim 17, forming a one-dimensional polymer chain.

19. An organic light-emitting diode (OLED) comprising an anode, a cathode and therebetween a light-emitting layer comprising the coordination complex of claim 1.

* * * * *